United States Patent
Torbatian et al.

(10) Patent No.: US 11,770,137 B1
(45) Date of Patent: Sep. 26, 2023

(54) ERROR FLOOR PERFORMANCE IMPROVEMENT OF GENERALIZED PRODUCT CODES

(71) Applicant: Infinera Corporation, San Jose, CA (US)

(72) Inventors: Mehdi Torbatian, Ottawa (CA); Han Henry Sun, Ottawa (CA)

(73) Assignee: Infinera Corporation, San Jose, CA (US)

( * ) Notice: Subject to any disclaimer, the term of this patent is extended or adjusted under 35 U.S.C. 154(b) by 0 days.

(21) Appl. No.: 17/481,296

(22) Filed: Sep. 21, 2021

Related U.S. Application Data

(60) Provisional application No. 63/080,957, filed on Sep. 21, 2020.

(51) Int. Cl.
*H03M 13/29* (2006.01)
*H03M 13/25* (2006.01)
*H03M 13/37* (2006.01)
*H03M 13/45* (2006.01)

(52) U.S. Cl.
CPC ..... *H03M 13/2909* (2013.01); *H03M 13/251* (2013.01); *H03M 13/3753* (2013.01); *H03M 13/45* (2013.01)

(58) Field of Classification Search
CPC .......... H03M 13/2909; H03M 13/251; H03M 13/3753; H03M 13/45
See application file for complete search history.

(56) References Cited

U.S. PATENT DOCUMENTS

2014/0325320 A1* 10/2014 Subramanian .... H03M 13/6505
714/785
2019/0237154 A1* 8/2019 Choi ..................... G11C 29/44

\* cited by examiner

*Primary Examiner* — Thien Nguyen
(74) *Attorney, Agent, or Firm* — David L. Soltz

(57) ABSTRACT

Systems and methods for improving the error floor performance in decoding generalized product codes (GPC) are described. The systems and methods can implement a two stage process to decode a GPC block code and break a stall error pattern for the decoding the block code. In the first stage, erroneuous bits in a codeword can be flagged. In the second stage, some of these bits and related bits in a codeword can be toggled to generate one or more test patterns. The test patterns can be decoded and one of them can be selected using a particular selection criteria to ultimately break the stall error pattern and improve the error floor performance.

20 Claims, 13 Drawing Sheets

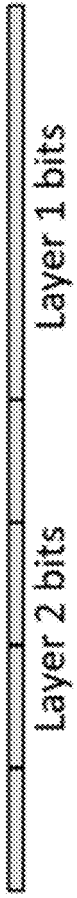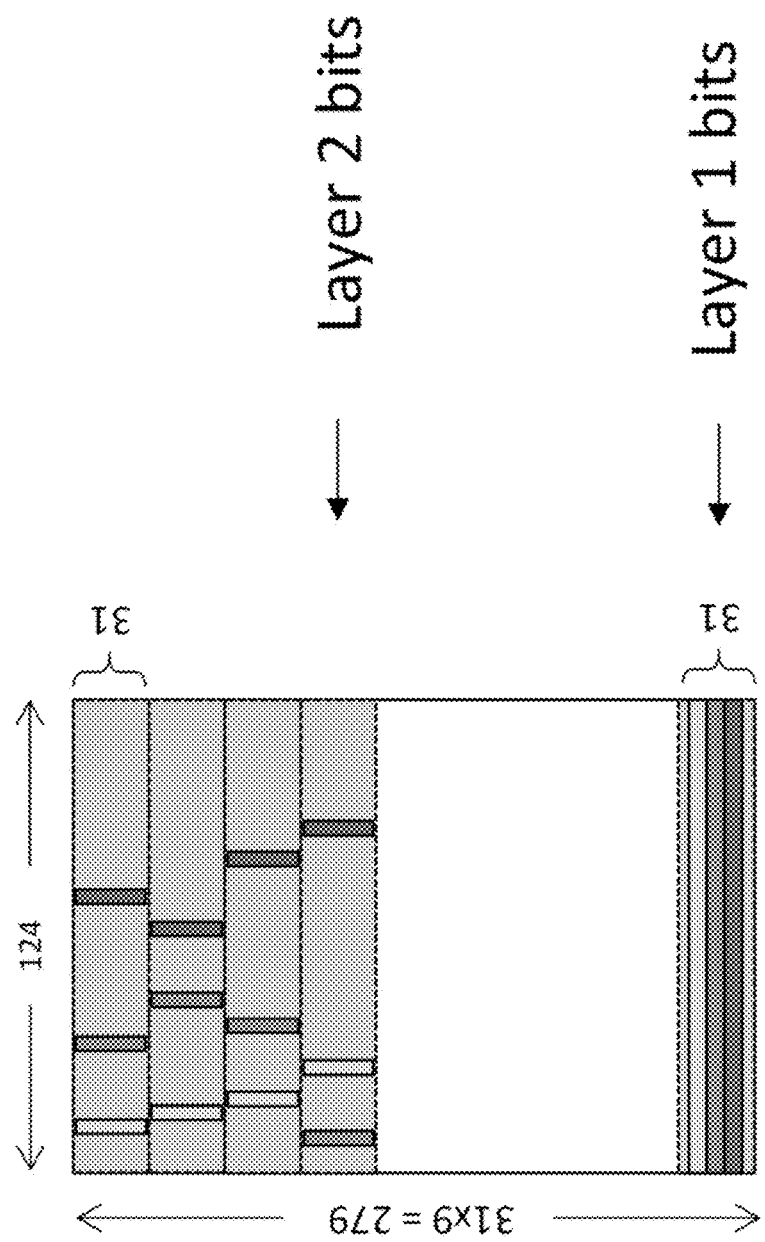
FIG. 2C(1)
FIG. 2C(2)

ERROR FLOOR PERFORMANCE IMPROVEMENT OF GENERALIZED PRODUCT CODES

CROSS-REFERENCE TO RELATED APPLICATION

This application claims the benefit of U.S. Provisional Application No. 63/080,957, filed Sep. 21, 2020, which is incorporated herein by reference in its entirety.

FIELD OF THE DISCLOSURE

This specification generally relates to improving performance of decoders of generalized product codes.

BACKGROUND

Decoders can be deployed in receivers to decode data received from a communication network. A bit error rate (BER) can be used as an indicator of the decoder's performance. However, attaining a low BER such that error free communication can be sustained can be very challenging.

SUMMARY

This disclosure describes systems, methods, devices, and other implementations for improving the error floor performance for generalized product codes (GPCs) when suboptimum hard decoding algorithms are used.

To improve the error floor performance, a two stage process can be used to decode a GPC block code and break a stall error pattern for the decoding the block code. In the first stage, erroneuous bits in a codeword can be flagged. In the second stage, some of these bits and related bits in a codeword can be toggled to generate one or more test patterns. The test patterns can be decoded and one of them can be selected using a particular selection criteria to ultimately break the stall error pattern.

According to some aspects, a device includes a receiver and at least one processor. The receiver is configured to receive a communication signal from a communication network. The communication signal includes data encoded using a generalized product code. The at least one processor is coupled to the receiver and includes a decoder. For a first decoding iteration, the at least one processor is configured to determine whether a number of errors associated with a first codeword of a block code in the data encoded using the generalized product code satisfies a capacity threshold. In response to determining that the number of errors associated with the first codeword does not satisfy the capacity threshold, the at least one processor is configured to set flags for bits in the first codeword. For a second decoding iteration that follows the first decoding iteration, the at least one processor is configured to determine whether a number of errors associated with a second codeword of the block code satisfies a second threshold. In response to determining the number of errors associated with the second codeword does not satisfy the second threshold, the at least one processor is configured to identify flagged bits in the second codeword, generate at least one test pattern based on the flagged bits, determine syndromes for the at least one test pattern, decode the at least one test pattern, select one of the at least one test pattern based on a selection criterion; and clear the flagged bits.

According to some aspects, a method is used to decode data encoded using a generalized product code in a communication signal. The method includes receiving, from a communication network, the communication signal with the data encoded using the generalized product code. For a first decoding iteration, the method includes determining, by at least one processor, whether a number of errors associated with a first codeword of a block code in the data encoded using the generalized product code satisfies a capacity threshold; and in response to determining that the number of errors associated with the first codeword does not satisfy the capacity threshold, setting flags for bits in the first codeword. For a second decoding iteration that follows the first decoding iteration, the method includes determining whether a number of errors associated with a second codeword of the block code satisfies a second threshold, and in response to determining the number of errors associated with the second codeword does not satisfy the second threshold, performing operations. These operations include identifying flagged bits in the second codeword, generating at least one test pattern based on the flagged bits, determining syndromes for the at least one test pattern, decoding the at least one test pattern, selecting one of the at least one test pattern based on a selection criterion, and clearing the flagged bits.

Implementations of these aspects can include one or more of the following features.

In some implementations, the first decoding iteration is a first half of a decoding iteration and the second decoding iteration is a second half of the decoding iteration that sequentially follows the first half of the decoding iteration.

In some implementations, the first codeword is a codeword extending in a horizontal direction across a block of the data and the second codeword is a codeword extending in a vertical direction across a block of the data. Alternatively, the first codeword is a codeword extending in a vertical direction across a block of the data and the second codeword is a codeword extending in a horizontal direction across the block of the data.

In some implementations, the first decoding iteration is a first decoding iteration and the second decoding iteration is a second decoding iteration that sequentially follows the first decoding iteration.

In some implementations, the first codeword is a codeword extending in a horizontal direction across a block of the data, and the second codeword is a codeword extending in a vertical or horizontal direction across the block of the data. Alternatively, the first codeword is a codeword extending in a vertical direction across a block of the data, and the second codeword is a codeword extending in a vertical or horizontal direction across the block of the data.

In some implementations, the device includes a memory to store location information of the bits in the first codeword for which flags were set. The memory is configured to provide location information of the flagged bits in the second codeword to the decoder.

In some implementations, the at least one processor is configured to determine whether syndromes in the first codeword are zero. In response to determining that the syndromes in the first codeword are not zero, the at least one processor is configured to determine whether the number of errors associated with the first codeword satisfy the capacity threshold.

In some implementations, the at least one processor is configured to determine whether syndromes in the second codeword are zero. In response to determining that the syndromes in the second codeword are not zero, the at least one processor is configured to determine whether the number of errors associated with the second codeword satisfy the second threshold.

In some implementations, to select one of the at least one test pattern based on a selection criterion, the at least one processor is configured to select a test pattern that (1) has a minimum number of bits flipped with respect to an original input sequence of the second codeword, and (2) has been decoded without errors.

In some implementations, the generalized product code comprises a turbo block code or a continuously interleaved Bose-Chaudhuri-Hocquenghem code.

According to some aspects, a receiver includes a memory and a decoder. The memory is configured to store data and provide the data to one or more components of the receiver. The decoder is coupled to the memory and configured to obtain the data from the memory. The decoder is configured to flag bits in a first codeword of a block code of the data in a first decoding iteration of the block code, and identify at least one of the flagged bits in the block code in a second decoding iteration of the block code. The second decoding iteration occurs after codewords in the block code have been processed in the first decoding iteration. The decoder is configured to generate a test pattern based on the identified at least one of the flagged bits, and decode the block code based on the test pattern.

In some implementations, the at least one of the flagged bits in the block code are identified in response to the decoder determining that a second codeword in the block code has a number of errors that is not less than a threshold.

The details of one or more implementations of the subject matter described in this specification are set forth in the accompanying drawings and the description below. Other features, aspects, and advantages of the subject matter will become apparent from the description, the drawings, and the claims.

BRIEF DESCRIPTION OF THE DRAWINGS

FIGS. 2C(1) and 2C(2) depict a structure of an example random CI-BCH product code and supporting memory structure.

Like reference numbers and designations in the various drawings indicate like elements.

DETAILED DESCRIPTION

A bit error rate (BER) threshold of $1 \times 10^{-15}$ is generally considered to be a threshold for error free communication in fiber optic systems. Coding schemes designed for communication systems, e.g., fiber optic systems, that satisfy this threshold (e.g., have error floor performance below this threshold) are generally considered viable solutions. The error floor can be attributed to the existence of graphical structures in the code that are not friendly with suboptimum iterative decoding algorithms. This disclosure describes implementations of Forward Error Correction (FEC) decoding methods to achieve strong error floor performance of GPC-type codes while keeping cost and complexity minimal.

Figure 1:
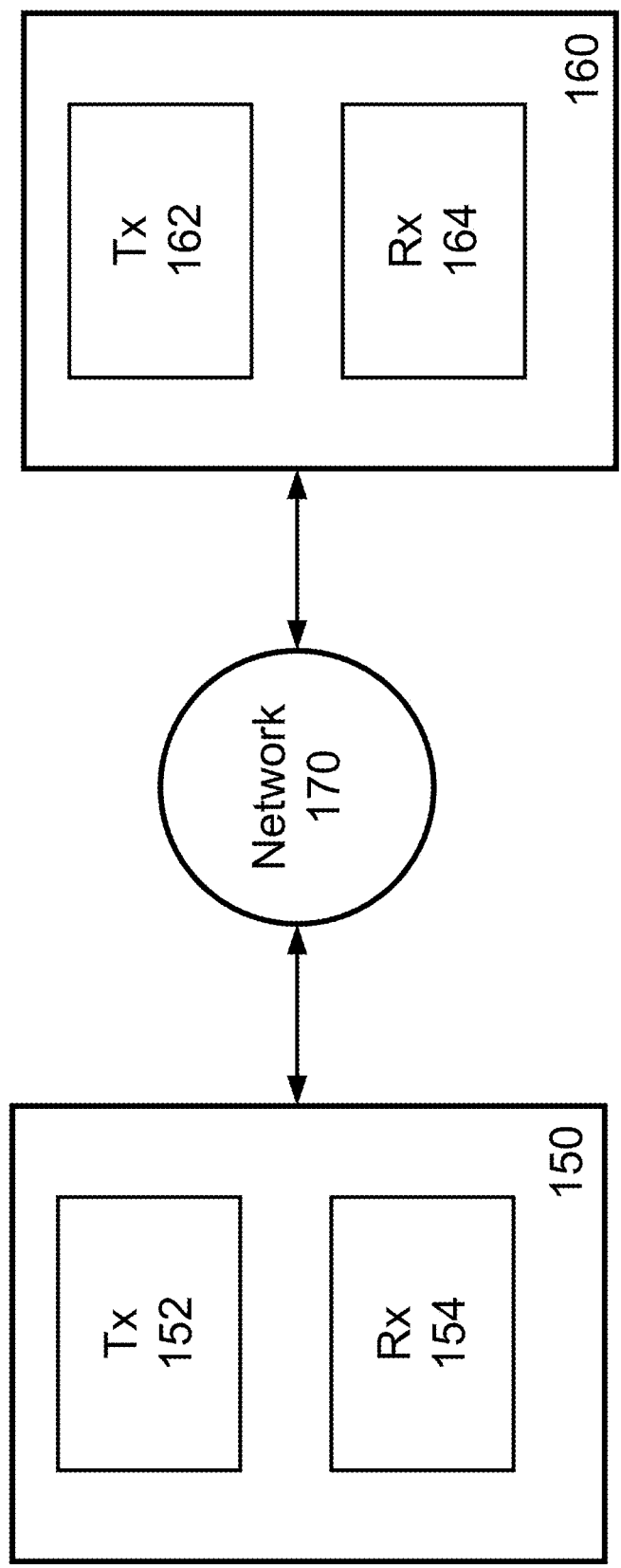
FIG. 1 depicts an example of an optical communication system.

FIG. 1 depicts an example communication system in which two devices 150, 160 are configured to communicate with each other over a communication network 170.

Each device 150 and 160 can be an electronic device configured to communicate over a wired and/or wireless network such as communication network 170. Each electronic device can be a portable or non-portable device. In some implementations, devices 150 and 160 are optical devices and can include, but are not limited to, lasers, optical sub-assemblies, original equipment manufacturer (OEM) modules, optical transceivers, sensors, modems, switches, filters, detectors, emitters, amplifiers, decoders, and encoders.

Device 150 can include a transmitter (Tx) 152 to transmit data to other devices, e.g., device 160, using the communication network 170. Device 150 can also include a receiver (Rx) 154 to receive data from other devices, e.g., device 160, via the communication network 170. Similarly, device 160 can include a transmitter (Tx) 162 to transmit data to other devices, e.g., device 150, through communication network 170, and a receiver (Rx) 164 to receive data from other devices, e.g., device 150, via communication network 170. For example, Tx 152 can transmit one or more modulated optical signals to Rx 164 through an optical communication path in the communication network 170. Devices 150 and 160 include various components such as memory devices and processors to process data to be sent and/or received over the communication network. Transmitters Tx 152, Tx 162 and receivers Rx 154, 164 can include antennas and supporting components such as amplifiers and filters to implement the communications.

The communication network 170 can be a wired and/or wireless network to facilitate communication between multiple electronic devices or components. In some implementations, the communication network 170 can include an optical communication network with optical fiber cables that enable transmission of data in the form of light signals between multiple network nodes and devices, such as devices 150 and 160. The optical communication network can include various components and devices to facilitate the transmission of data across the network. These devices include, for example, amplifiers to amplify a modulated optical signal at various locations along an optical communication path in the optical communication network.

Communications between two devices 150 and 160 can be encoded by the transmitting device and then decoded by the receiving device. In general, various suitable coding techniques can be utilized to implement encoding and decoding of data. One category of code that has strong forward error correction (FEC) encoding performances in optical communication systems is generalized product codes (GPCs). Product codes (PCs) protect a two-dimensional array of bits comprising two short block component codes, commonly called horizontal and vertical codes, to protect data in orthogonal directions. GPCs are extensions of PCs and refer to a family of codes that include block codes and convolutional codes.

Figure 2A:
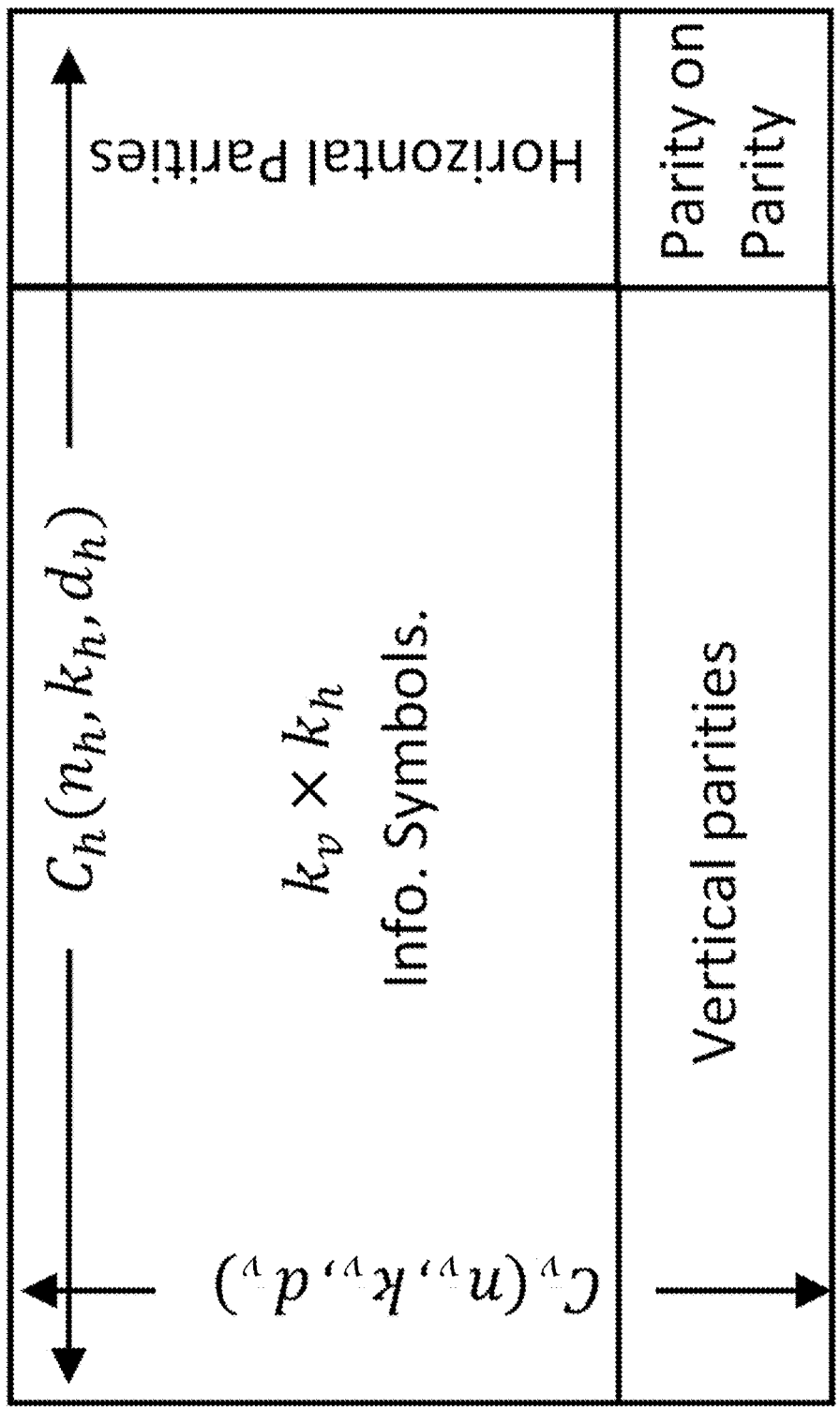
FIG. 2A depicts a structure of an example turbo block code.

Examples of GPCs include, but are not limited to, staircase, braided, half-product, turbo, and continuously-interleaved Bose-Chaudhuri-Hocquenghem (CI-BCH) product codes. An example structure of a GPC, such as a turbo block code, is shown in FIG. 2A, and includes two component linear block codes $C_v(n_v, k_v, d_v)$, and $C_h(n_h, k_h, d_h)$. The component codes protect a block of information symbols of size $k_v \times k_h$ in both vertical and horizontal directions. For both block codes, n, k, d are a codeword length, input sequence length, and the minimum hamming distance of the code. $C_v$ is first applied on every column of the information block to construct an extend block of symbols of size $n_v \times k_h$. Then $C_h$ is applied to every row of the new block to construct the final codeword of the PC of size $n_v \times n_h$ symbols. The minimum hamming distance of the resulted PC is equal to $d_{min}=d_v \times d_h$. One can use the same component code for both vertical and horizontal directions, and can apply the horizontal encoding first followed by the vertical encoding, or vice versa. The parity of each row is provided by parity bits in the right-most column, and the parity of each column is provided by parity bits in bottom-most row.

Figure 2B:
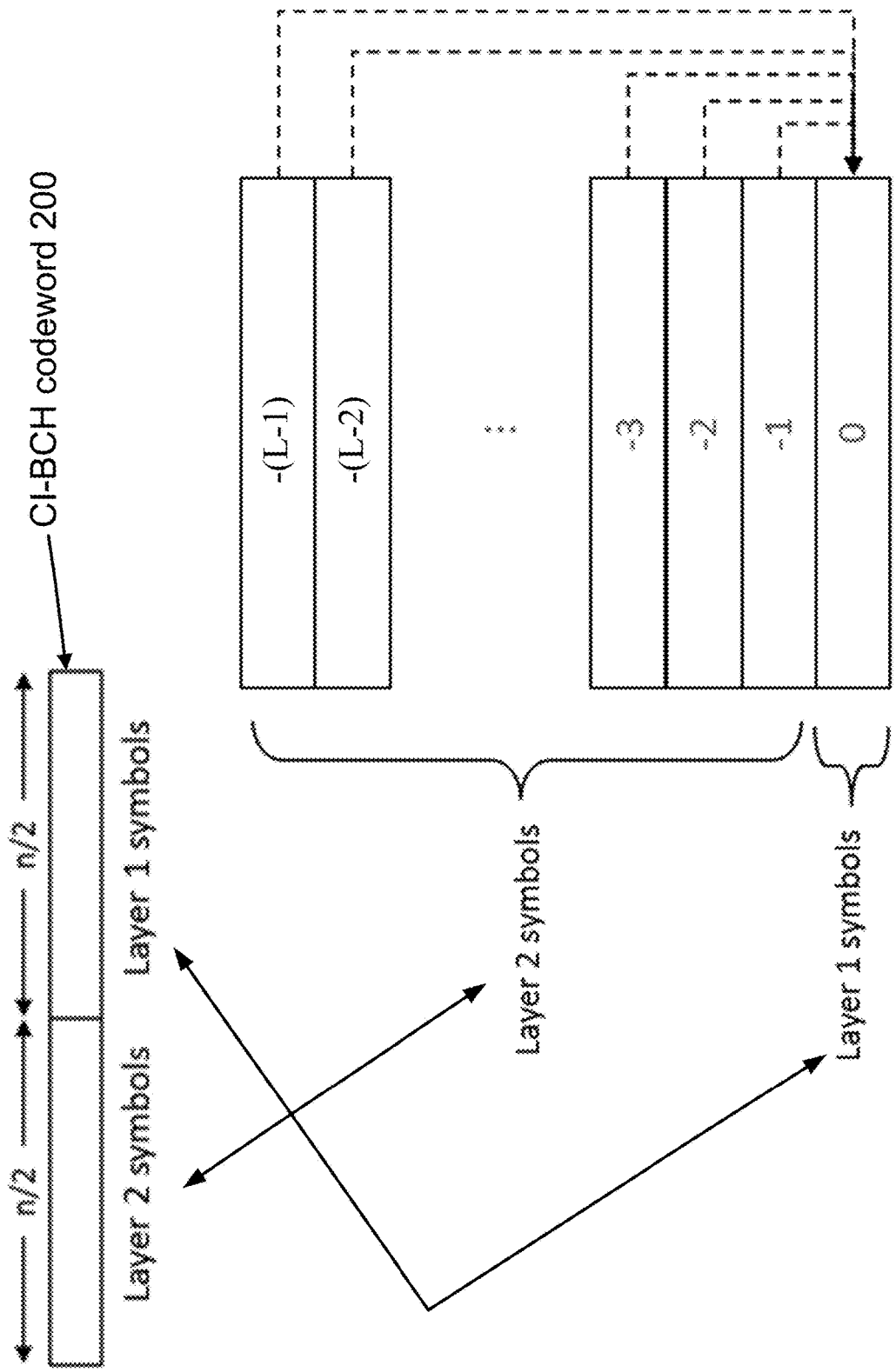
FIG. 2B depicts a structure of an example continuously-interleaved Bose-Chaudhuri-Hocqueng hem (CI-BCH) product code.

CI-BCH and braided codes are examples of convolutional GPC codes. An example structure of a convolutional GPC (CI-BCH) codeword 200 is shown in FIG. 2B. In FIG. 2B, "0" represents the current clock cycle, "−1" represents one clock cycle earlier, and "−2" represents the clock cycle before "−1." For a codeword in clock cycle 0, half of the symbols come from the same clock cycle, while the other half comes from encoded symbols from earlier clock cycles. Thus, each component codeword comprises of two parts. The first part consists of symbols that are already encoded at least one time (from clock cycles −1 to −(L−1)), and thus the current codeword is the second layer of protection for them. These symbols are referred to as "Layer 2" symbols. The second part of each codeword comprises of new information symbols and the generated parities. These symbols are referred to as "Layer 1" symbols as they only have been protected one time till encoding of the current codeword. The Layer 1 symbols are stored in the memory after the encoding procedure is completed as encoded symbols in clock cycle 0. They will be used in later clock cycles as Layer 2 symbols. In this manner, PCs can be extended to a convolutional structure carrying the same or better code properties.

FIG. 2C illustrates an example of a unique random CI-BCH code structure developed by Infinera Corporation. Details of this code structure are described in U.S. Patent Application No. 17/327,064, filed on May 21, 2021, which is hereby incorporated in its entirety in this disclosure. The illustrated example in FIG. 2C(1) shows a BCH(248,231,6) codeword (codeword length −248; input sequence length −231; and minimum hamming distance of the code −6). Each clock cycle can contain 31 half BCH codewords equivalent to 31 ×124=3844 bits A configuration of a memory in support of the random CI-BCH code shown in FIG. 2C(1) is illustrated in FIG. 2C(2). Bits for the random CI-BCH codeword can be selected from the memory. For example, at clock cycle 0, bits from the Layer 1 bit can be selected for use in the codeword. A combination of multiple columns of data from previous clock cycles is used as Layer 2 symbols. The layer 2 symbols can be chosen such that the intersection of every two distinct codewords is maximum at one bit. In FIG. 2C(2), the same color portions of bits construct one BCH codeword. In the illustrated example, each clock cycle can contain 31 half BCH codewords equivalent to 31 ×124=3844 bits.

Figure 2D:
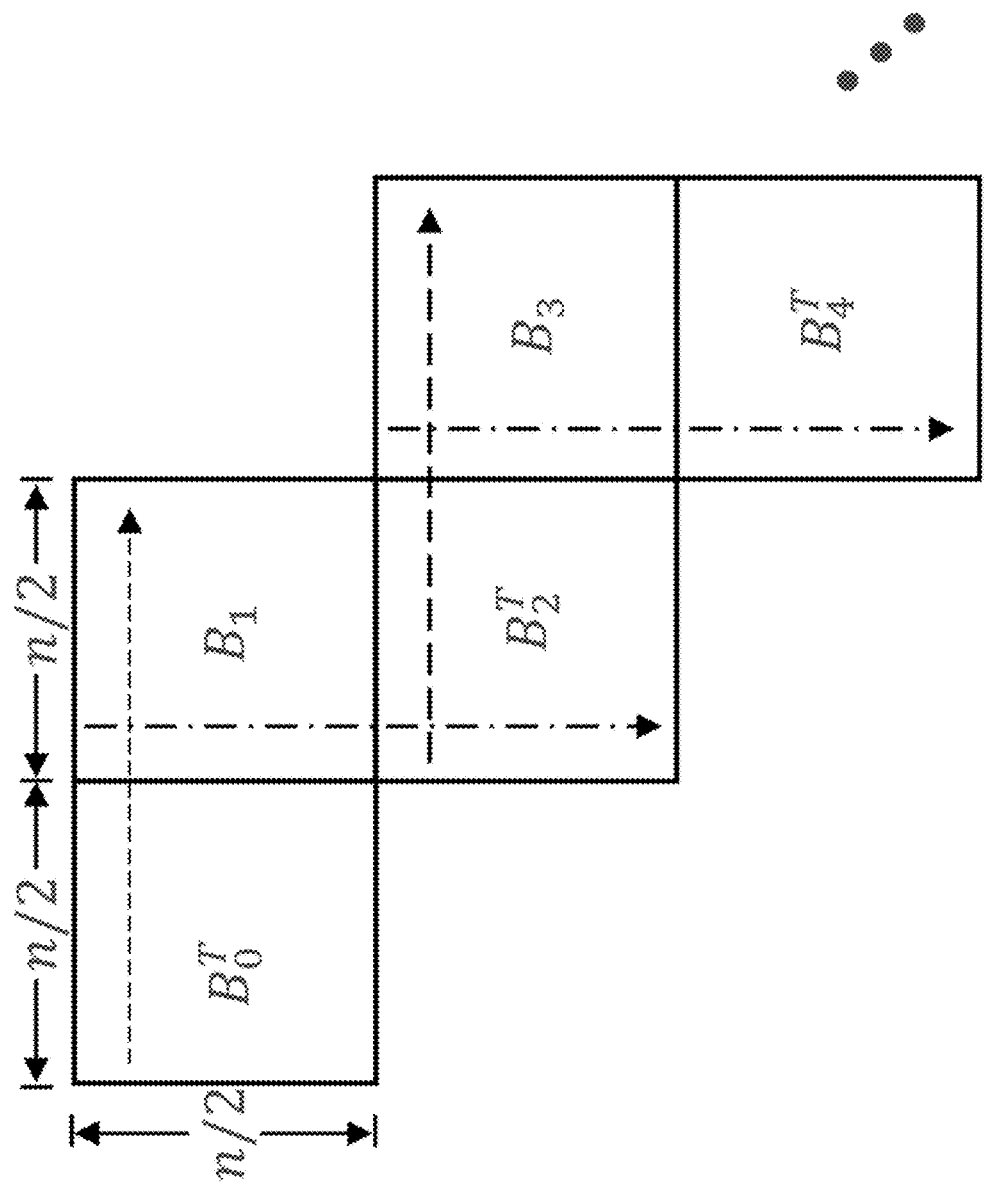
FIG. 2D depicts a structure of an example staircase product code.

FIG. 2D illustrates an example of a staircase produce code, which is another example of a CI-BCH code type. A staircase code gives the appearance of a staircase because subsequent blocks are added horizontally and vertically, in a sequential manner. For example, as shown in FIG. 2D, block $B_1$ is added horizontally to the right of the initial block, block $B_0$. A transpose of the next block code, $B_2$, is added vertically to the bottom of block $B_1$. This pattern can be repeated in such a manner that the odd numbered block codes are added to the right of the previous even-numbered block code, and the transpose of even numbered block codes are added to the bottom of the previous odd-numbered block code.

If the same component code for both vertical and horizontal directions is used, a block of $n/2 \times (k-n/2)$ of information symbols can be added to the staircase each time a new block of information or data is added to the staircase code. In a staircase structured code, the bits across one column of the two vertical blocks or the bits across one row of two horizontal blocks form codewords, as shown by the dotted arrows. In this manner, half the bits of every new codeword include bits that are already protected one time in encoding of a previous block of bits (referred to as Layer 2 bits or symbols), and half the bits may belong to a block of new bits received or processed in the current clock cycle (clock cycle 0) plus the parity symbols generated through the encoding procedure. These bits can be referred to as "Layer 1" bits or symbols.

Figure 3:
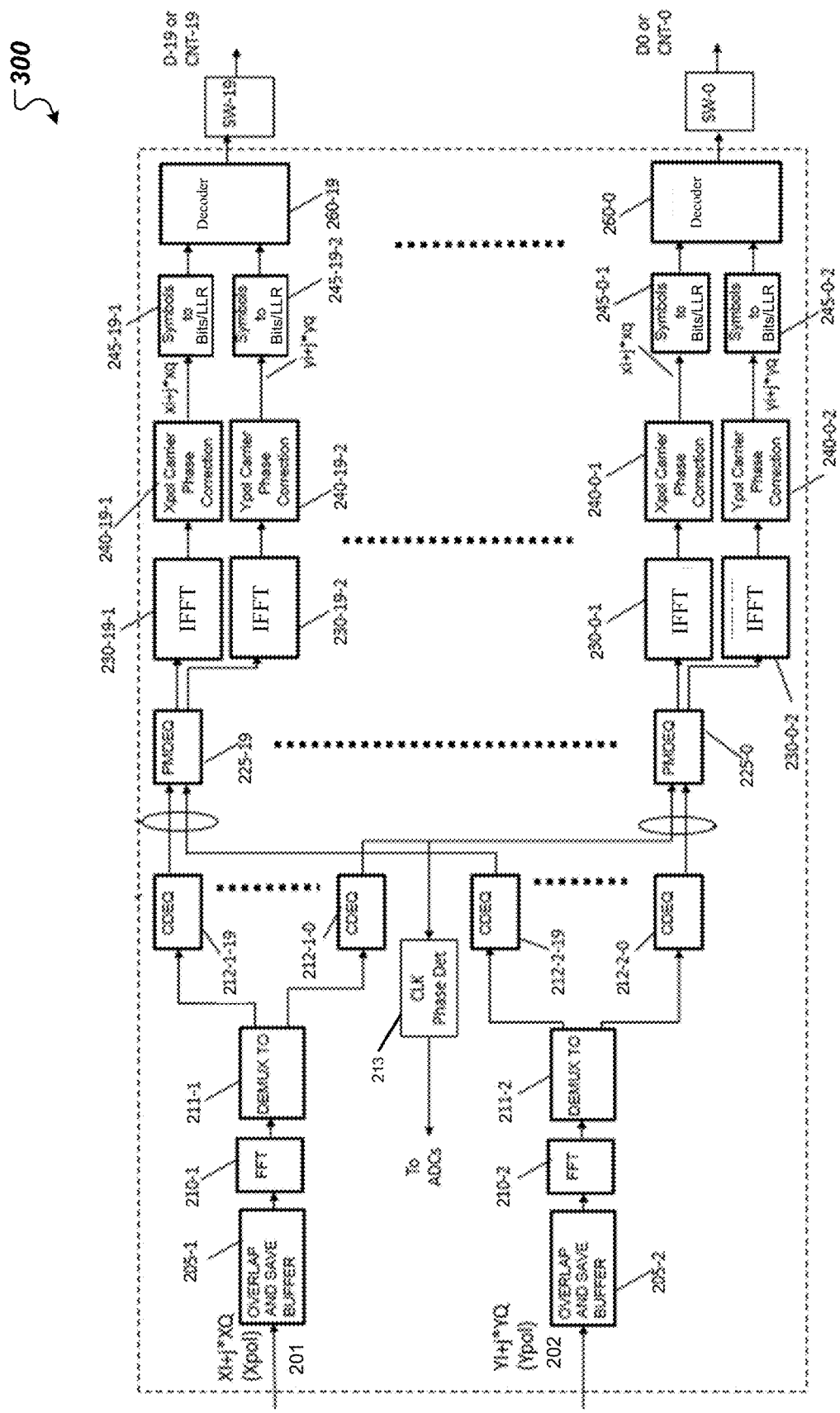
FIG. 3 depicts an example of a processor in an optical receiver.

FIG. 3 illustrates an exemplary implementation of a Rx processor 300 included in a receiver such as Rx 154 or 164. While the Rx processor 300 in FIG. 3 is described below according to certain functional components, in some implementations, the Rx processor 300 can include additional functional components, fewer functional components, different functional components, or differently arranged functional components. Not all the components shown in FIG. 3 are necessary and some components, such as the symbols-to-bits circuits, may optionally be included or excluded. Furthermore, the components of the Rx processor 300 can be arranged in various ways while processing a received signal and implementing the decoding methods described herein. Accordingly, the implementation illustrated in FIG. 3 is merely one example of a receiver system that can execute early termination decoding methods for power optimization described herein.

Referring to FIG. 3, a signal that can include multiple subcarriers can be received from an optical network such as network 170. The received signal can be received by one or more antennas (not shown) and processed by one or more analog-to-digital circuits (ADCs) (not shown) that are configured to output digital samples of the received analog signal. In one example, the samples can be supplied by each ADC at a rate of 64 GSamples/s. The digital samples may correspond to symbols carried by the X polarization of the optical subcarriers and can be represented by the complex number Xl+jXQ 201.

The digital samples can be provided to one or more overlap and save buffer(s) 205, as shown in FIG. 3. One or more fast Fourier transform (FFT) component(s) or circuit(s) 210 can receive the vector elements from the overlap and save buffer(s) 205 and convert the vector elements to the frequency domain using, for example, a FFT. One or more FFT component(s) 210-1 can convert the vector elements to frequency components, each of which can be stored in a register or "bin" or other memory, as a result of carrying out the FFT.

The frequency components can be demultiplexed by one or more demultiplexers 211-1, and groups of such components can be supplied to m respective chromatic dispersion equalizer circuit(s) (CDEQ) 212-1-0 to 212-1-*m*, each of which can include a finite impulse response (FIR) filter that corrects, offsets or reduces the effects of, or errors associated with, chromatic dispersion of the transmitted optical subcarriers. In the figures and subsequent description m equals the number of subcarriers. For the purposes of this example, the number of subcarriers is twenty (20).

Each of CDEQ circuit(s) 212-1-0 to 212-1-19 supplies an output to a corresponding polarization mode dispersion (PMD) equalizer circuit 225-0 to 225-19 (which collectively can be referred to as PMDEQs 225). PMD equalization can be executed in the frequency domain, as shown in FIG. 3, or it can be executed in the time domain after inverse FFT(s) (IFFT(s)) 230 and before carrier phase correction (CPCs 240).

Digital samples output from ADC(s) associated with Y polarization components 202 of a received signal can be processed in a similar manner to that of digital samples output from ADC(s) associated with the X polarization component of the received signal. Namely, overlap and save buffer 205-2, FFT 210-2, demultiplexer 211-2, and CDEQ circuits 212-2-0 to 212-2-19 can have a similar structure and operate in a similar fashion as buffer 205-1, FFT 210-1, demultiplexer 211-1, and CDEQ circuits 212-1-0 to 212-1-19, respectively. For example, each of CDEQ circuits 212-2-0 to 212-19 can include an FIR filter that corrects, offsets, or reduces the effects of, or errors associated with, chromatic dispersion of the transmitted optical subcarriers. In addition, each of CDEQ circuits 212-2-0 to 212-2-19 provide an output to a corresponding one of PMDEQ 225-0 to 225-19.

The output of one of the CDEQ circuits, such as CDEQ 212-1-0, can be supplied to clock phase detector circuit 213 to determine a clock phase or clock timing associated with the received subcarriers. Such phase or timing information or data can be supplied to ADCs to adjust or control the timing of the digital samples output from the ADCs.

Each of PMDEQ circuits 225 can include another FIR filter that corrects, offsets or reduces the effects of, or errors associated with, PMD of the transmitted optical subcarriers. Each of PMDEQ circuits 225 can supply a first output to a respective one of IFFT components or circuits 230-0-1 to 230-19-1 and a second output to a respective one of IFFT components or circuits 230-0-2 to 230-19-2. In some implementations involving 256 samples, each of the IFFT components or circuits 230 can convert a 256-element vector back to the time domain as 256 samples in accordance with an inverse fast Fourier transform (IFFT).

Time domain signals or data output from IFFT 230-0-1 to 230-19-1 are supplied to a corresponding one of Xpol carrier phase correction circuits 240-0-1 to 240-19-1, which can apply carrier recovery techniques. In some implementations, each carrier phase correction circuit 240-0-1 to 240-19-1 can compensate or correct for frequency and/or phase differences between the X polarization of the transmit signal and the X polarization of light from a local oscillator in the receiver based on an output of Xpol carrier recovery circuits 240-0-1 to 240-19-1, which performs carrier recovery in connection with one of the subcarrier based on the outputs of IFFTs 230-0-1 to 230-19-1. After such X polarization carrier phase correction, the data associated with the X polarization component can be represented as symbols having the complex representation xi+j*xq in a constellation, such as a Quadrature Phase Shift Keying (QPSK) constellation or a constellation associated with another modulation formation, such as an m-quadrature amplitude modulation (QAM), m being an integer. In some implementations, the taps of the FIR filter included in one or more of PMDEQ circuits 225 can be updated based on the output of at least one of carrier phase correction circuits 240-0-1 to 240-19-01.

In a similar manner, time domain signals or data output from IFFT 230-0-2 to 230-19-2 are supplied to a corresponding one of Ypol carrier phase correction circuits 240-0-2 to 240-19-2, which can apply carrier recovery techniques. In some implementations, each carrier phase correction circuit 240-0-2 to 240-19-2 also can correct or compensate for frequency and/or phase differences between the Y polarization of the transmit signal and the Y polarization of light from the receiver's local oscillator. After such Y polarization carrier phase correction, the data associated with the Y polarization component can be represented as symbols having the complex representation yi+j*yq in a constellation, such as a QPSK constellation or a constellation associated with another modulation formation, such as an m-quadrature amplitude modulation (QAM), m being an integer. In some implementations, the output of one of circuits 240-0-2 to 240-19-2 can be used to update the taps of the FIR filter included in one or more of PMDEQ circuits 225 instead of, or in addition to, the output of at least one of the carrier recovery circuits 240-0-1 to 240-19-1.

The equalizer, carrier recovery, and clock recovery can be further enhanced by utilizing the known (training) bits that can be included in control signals CNT, for example by providing an absolute phase reference between the transmitted and local oscillator lasers.

In some implementations, one or more symbols-to-bits circuits or components 245-0-1 to 245-19-1 can be included in the Rx processor 300. In such implementations, each of the symbols-to-bits circuits or components 245-0-1 to 245-19-1 can receive the symbols output from a corresponding one of circuits 240-0-1 to 240-19-1 and map the symbols back to bits. For example, each of the symbol-to-bits components 245-0-1 to 245-19-1 can demap one X polarization symbol, in a QPSK or m-QAM constellation, to Z bits, where Z is an integer. For dual-polarization QPSK modulated subcarriers, Z is two. Bits output from each of component 245-0-1 to 245-19-1 are provided to a corresponding one of decoder circuits 260-0 to 260-19.

Y polarization symbols are output from a respective one of circuits 240-0-2 to 240-19-2, each of which has the complex representation yi+j*yq associated with data carried by the Y polarization component. Each Y polarization, like the X polarization symbols noted above, can be provided to a corresponding one of bit-to-symbol circuits or components 245-0-2 to 245-19-2, each of which has a similar structure and operates in a similar manner as symbols-to-bits component 245-0-1 to 245-19-1. Each of circuits 245-0-2 to 245-19-2 can provide an output to a corresponding one of decoder circuits 260-0 to 260-19.

Each of decoder circuits 260 can remove errors in the outputs of symbol-to-bit circuits 245 using, for example, forward error correction. Such error corrected bits, which can include user data, can be supplied to a corresponding one of switch circuits SW-0 to SW-19. Switch circuits SW-0 to SW-19 in each secondary node 112 can selectively supply or block data based on whether such data is intended to be output from a particular node.

Maximum likelihood decoders can provide the best performance for decoding GPC codes. For example, a maximum likelihood decoder can be approximated by bounded distance decoding (BDD) of the whole codeword under Gaussian channel assumption. However, such decoders can be expensive and complex to implement. When using suboptimum decoding, the independent BDD of the horizontal and vertical component codewords of a block code can be processed sequentially. For example, after codewords in a block code are decoded horizontally, the codewords can then be decoded vertically, or vice versa. Such decoding can be repeated until all the syndromes are zero or a maximum number of iterations is reached. Each round of decoding in both horizontal and vertical directions is called an iteration. In such decoding techniques, the error floor performance can be determined by the minimum size stall error pattern that can be fixed neither in horizontal, nor in vertical directions alone.

To improve the error floor performance of this type of generalized product codes, methods and systems implementing a simple Bit-Flag Bit-Toggle algorithm can be employed to break the minimum size stall error pattern. These methods and systems can significantly improve the bit error rate (BER) range of interest without substantially increasing the costs and complexity. While turbo product codes and CI-BCH codes are used as example codes, it should be understood that these methods and systems can be applied to various GPC codes.

Figure 4A:
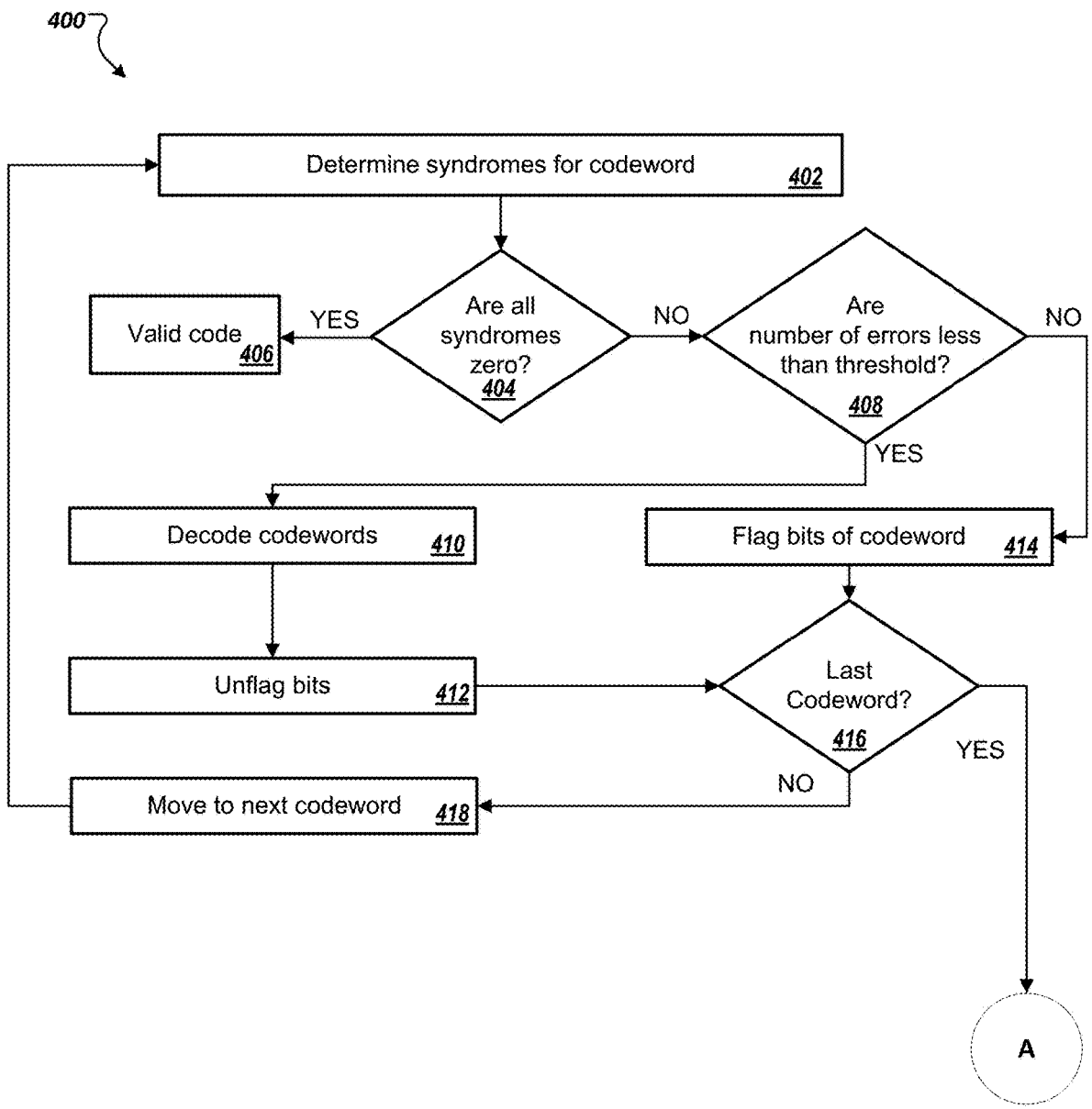
FIGS. 4A and 4B illustrate flowcharts of an example of a Bit-Flag Bit-Toggle decoding method.
Figure 4B:
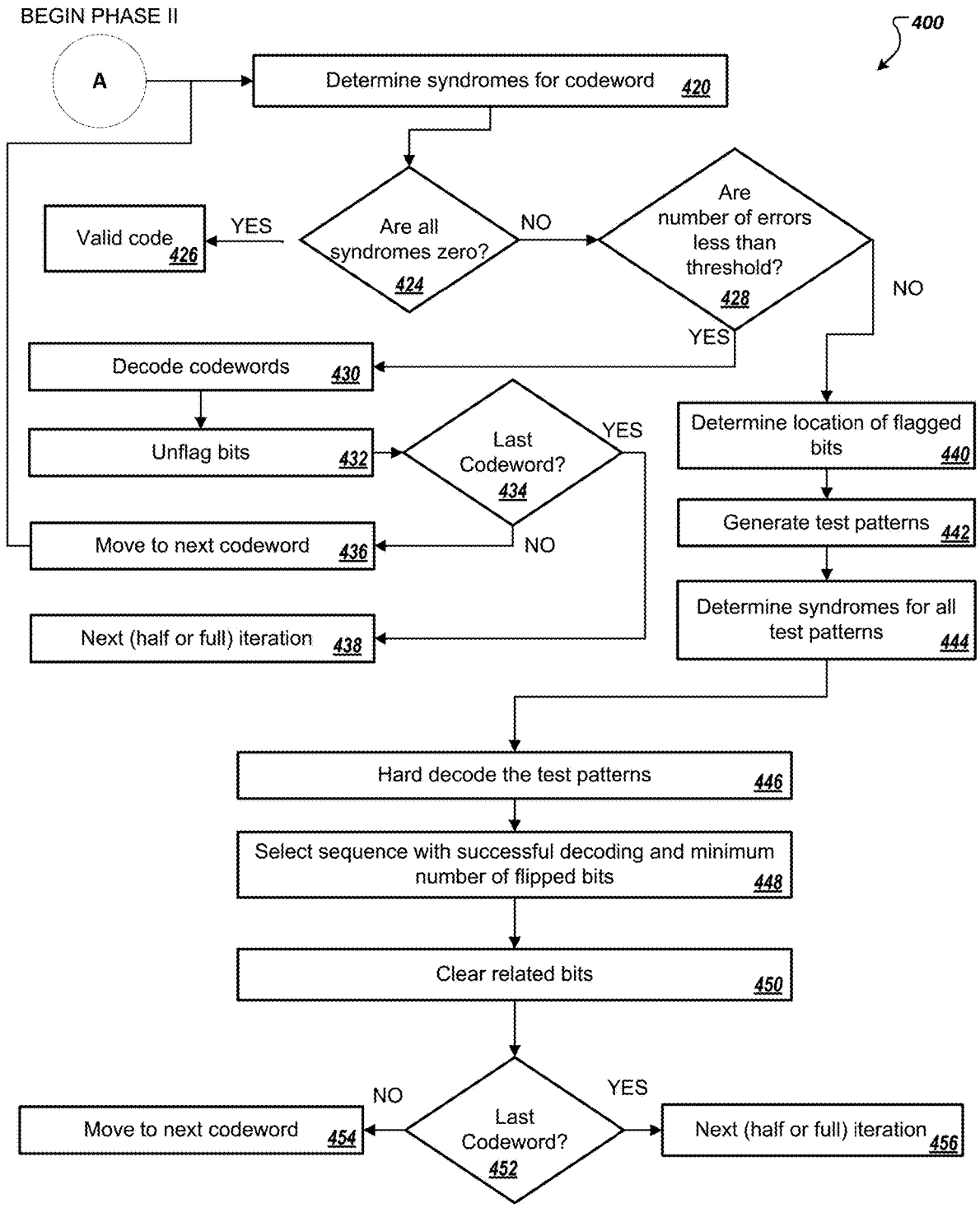

FIGS. 4A and 4B illustrate flowcharts of an example of a Bit-Flag Bit-Toggle decoding method 400. In some implementations, this method can be applied on two consecutive half iterations (horizontal and vertical) of a full decoding iteration. In some implementations, the method 400 can be applied on two consecutive full decoding iterations. Depending on the type of code, the method 400 can be applied on half iterations, full iterations or both. When half iterations are performed, the decoder can perform decoding in one direction (e.g., row or horizontally across a block) in the first iteration and then perform decoding in the second direction (e.g., column or vertically across a block) in the second iteration, or vice versa. When full iterations are performed, the decoder can perform decoding in both directions (e.g., horizontally and vertically across a block) in the first iteration and then perform decoding in both directions in the second iteration.

The operations performed in FIGS. 4A and 4B are described as being performed by a decoder (such as decoder circuit 260), but one or more of the operations can also be performed by a processor or other electronic components coupled to the decoder. Data to be decoded can be stored in a memory as an original input data sequence and can subsequently be obtained for processing.

Method 400 can be divided into two phases. The first phase (corresponding to FIG. 4A) can be referred to as the Bit-flag decoding stage and includes operations 402-418. The second phase (corresponding to FIG. 4B) can be referred to as the Bit-toggle decoding stage and includes 420-456. In the description below, $C_h$ and $C_v$ refer to the horizontal and vertical component codes of the GPC code, respectively, and t refers to the error correcting capability of the component codes.

Turning to FIGS. 4A and 4B, the method 400 can be initiated under a half or full decoding iteration by looping through codewords within a block code. For each codeword, the decoder can determine the syndromes for the codeword (402). The decoder can determine if all syndromes are zero (404). If the syndromes are all zero, the code is valid (406) and the decoder may move to the next codeword or stop decoding if the last codeword in the block code has been reached. If all the syndromes are not zero, the decoder can determine whether the number of the number of errors in the codeword is less than the error correcting capability (threshold t) of the code (408).

If the number of errors is less than or equal to the threshold t, the codeword can be decoded using one or more suitable syndrome decoding schemes for the code (410). If there are bits that have been flagged from an earlier iteration, the bits can be unflagged (412).

If the number of syndromes is greater than or equal to the threshold t, the decoder can flag the bits of the codeword (414). In some implementations, all the bits of the codeword are flagged when codes from the family of product codes or the family of CI-BCH codes are being processed. In some implementations, half or a portion of the bits of the codeword are flagged when codes from the family of CI-BCH codes are being processed. The location of the flagged bits can be stored in a memory so that the bits can be identified for future processing.

After the bits of the codeword have been flagged or unflagged, the decoder can check whether additional codewords remain or if the codeword is the last codeword in the block code (416). If the codeword is not the last codeword, the decoder can move to the next codeword (418) and repeat operations 402-416. For example, if the decoder is processing a vertical codeword, the decoder can process the next vertical codeword (e.g., next column in block code). If the decoder is processing a horizontal codeword, the decoder can process the next horizontal codeword (e.g., next row in block code).

If the codeword is the last codeword in the vertical or horizontal direction, the decoder has completed a half iteration or full iteration and can start phase II of the decoding method. Referring to FIG. 4B, in a half or full decoding iteration right after the bit-flag decoding stage (operations 402-416), the decoder can loop through codewords of the block code in phase II and determine the syndromes for codewords (420) processed in operations 402-416.

The decoder can perform operations 424-436 in substantially the same manner as described above with respect to operations 402-412, 416. However, for operation 428, in response to the decoder determining that the number of errors in a codeword is greater than a threshold, e.g., t−1, the decoder can determine a location of a determined number of flagged bits (440). For instance, the decoder can access the memory that stores information regarding the flagged bits to determine the location of the codeword bits flagged in operation 414. If q flagged bits are selected, the decoder can generate a maximum of 2q test patterns by toggling the flagged bits between available states 0, 1 (442). For instance, if 3 flagged bits are located in a codeword, 8 test patterns can be generated based on the different combination of 0's and 1's for the three bits. The decoder can determine the syndromes for all the test patterns (444) and hard decode the test patterns based on syndrome decoding principles (446). Next, the decoder can select one of the test patterns that was successfully decoded (without errors) and has a minimum number of bits flipped with respect to the original input sequence of the codeword (448). The decoder can retrieve the original input sequence from a memory and can compare each test sequence to the original input sequence to determine the number of flipped bits. The decoder can use the selected test sequence to decode the codeword. In doing so, the decoder can clear the related bits (450). If the decoding is successful, then the flagged bits associated to that codeword are cleared.

After clearing the bits, the decoder can determine if the codeword processed is the last codeword (452). If the codeword is not the last codeword, the decoder can move to the next codeword in the block code (454). If the codeword is the last codeword, the decoder can move to the next half or full iteration until the maximum number of iterations have been performed (456). Similarly, returning to FIG. 4A, if the codeword is the last codeword in operation 434, the decoder can move to the next half or full iteration until the maximum number of iterations have been performed (438).

After all the codewords in received encoded data is decoded by a decoder, e.g., decoder circuits 260-0 to 260-19, the decoded data can be used for further processing within a receiver. For example, the decoded data can be sent to switch circuits SW-0 to SW-19 which can provide the data to other components such as a display or user interface coupled to the receiver.

In some implementations, to reduce the complexity, one can avoid full decoding of all test patterns in the Bit-Toggle stage. Syndromes can be calculated recursively for all test patterns. The number of errors for each test pattern can be estimated from the syndromes. Only the test pattern with the minimum number of bit flipped is fully decoded.

Figure 5A:
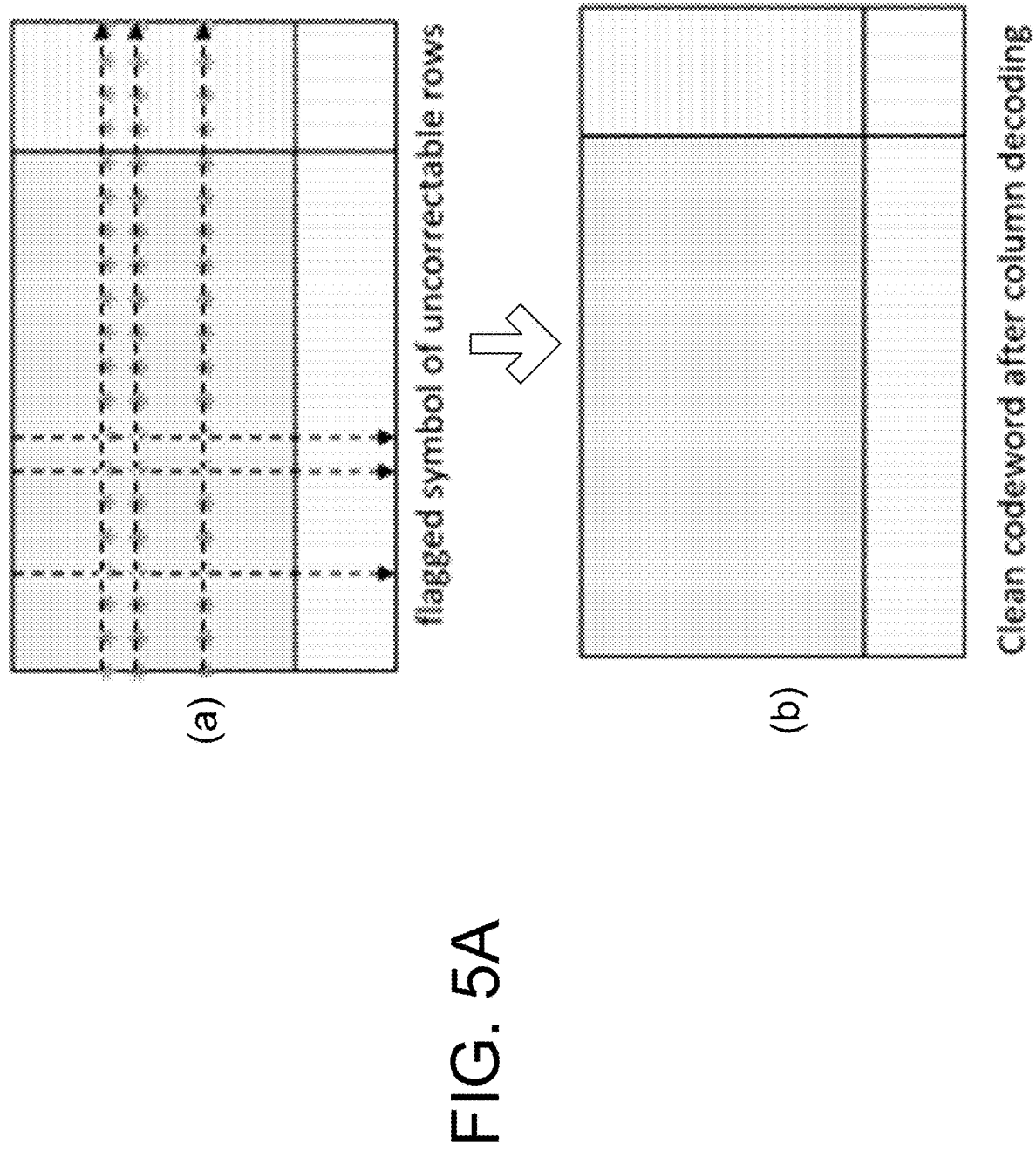
FIG. 5A depicts an example of decoding a turbo block code over consecutive half iterations.

Examples of the implementations of method 400 are illustrated in FIGS. 5A-5D. FIG. 5A depicts a turbo block code with error correcting capability t=2 for the component codes and a 3 ×3 stall error pattern. Decoding can be performed over two consecutive half iterations. For instance, the run bit-flag stage can be performed first for decoding horizontal codewords, and then the Bit-Toggle stage can be performed next for decoding vertical codewords.

In more detail, during the first Bit-Flag stage involving row (Horizontal) decoding, all rows except the ones related to the stall error pattern are correctable. These rows can become error free row codewords after decoding is completed. The rows with non-zero syndromes (erroneous rows) related to stall error pattern are identified and all the bits of these rows are flagged for treatment under the Bit-Toggle stage in column decoding. The flagged bits are shown with "x" markers.

In the Bit-Toggle stage involving column (vertical) decoding, all columns except the ones related to the stall error pattern are correctable. The columns can become error free column codewords after decoding. We clean the flag for all the bits of these codewords. For the columns related to the stall error pattern, the number of errors more than t −1 is detected. For each of these columns, q=3 flagged symbols are selected. A total of 8 test patterns is generated. Each of them is decoded. The first codeword with the minimum total number of flipped (due to test pattern and hard decoding) bits is selected as the decoded codeword. If no error occurs, the stall error pattern breaks with a total of 3 bits flipped. And the resulted codeword becomes clean.

Figure 5B:
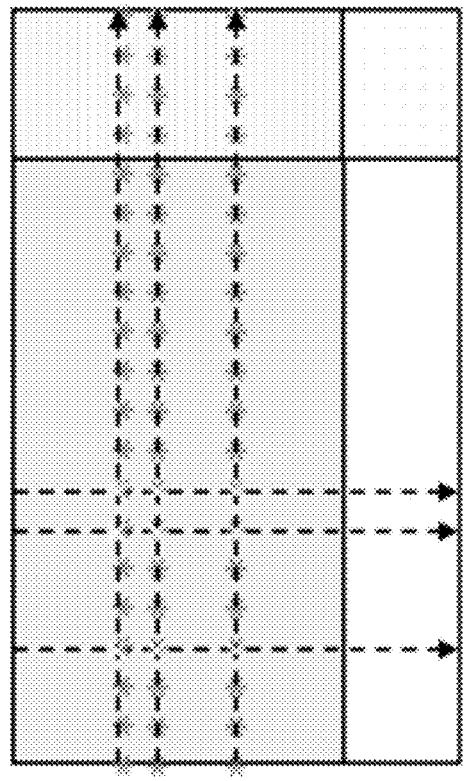
FIG. 5B depicts an example of decoding a turbo block code over consecutive full iterations.
Figure 5B:
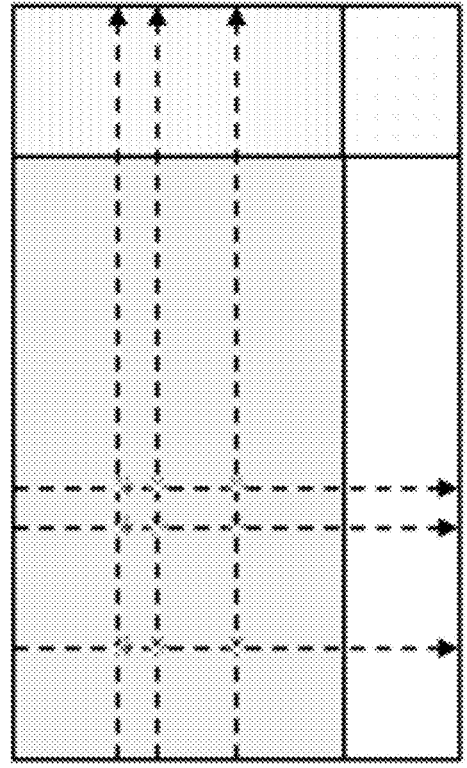

FIG. 5B depicts an example of decoding a GPC over two consecutive full iterations. The Bit-Flag stage can be performed over a full iteration of row and column decoding. In such implementations, the stall error pattern can be fully identified. The Bit-Toggle stage to break the stall error pattern can be applied on the next full iteration. Thus, two full iterations can be performed for decoding the block code. During the first iteration (N), the bits of uncorrectable rows are flagged in row decoding as shown (FIG. 5B-(a)). The bits of correctable column codewords can be unflagged during column decoding. At this point, the stall error pattern can be identified if it exists.

During the second iteration (N+1), the Bit-Toggle procedure can be performed on row decoding to break the stall error pattern if there exist any. If the row decoding is successful, the related bits are unflagged (FIG. 5B-(a)). Otherwise, the related bits may get flagged again to provide a second chance when they go through column decoding procedure. The Bit-Toggle procedure is then performed in column decoding to break the stall error pattern if there exists any. If the column decoding is successful, the related bits are unflagged.

Figure 5C:
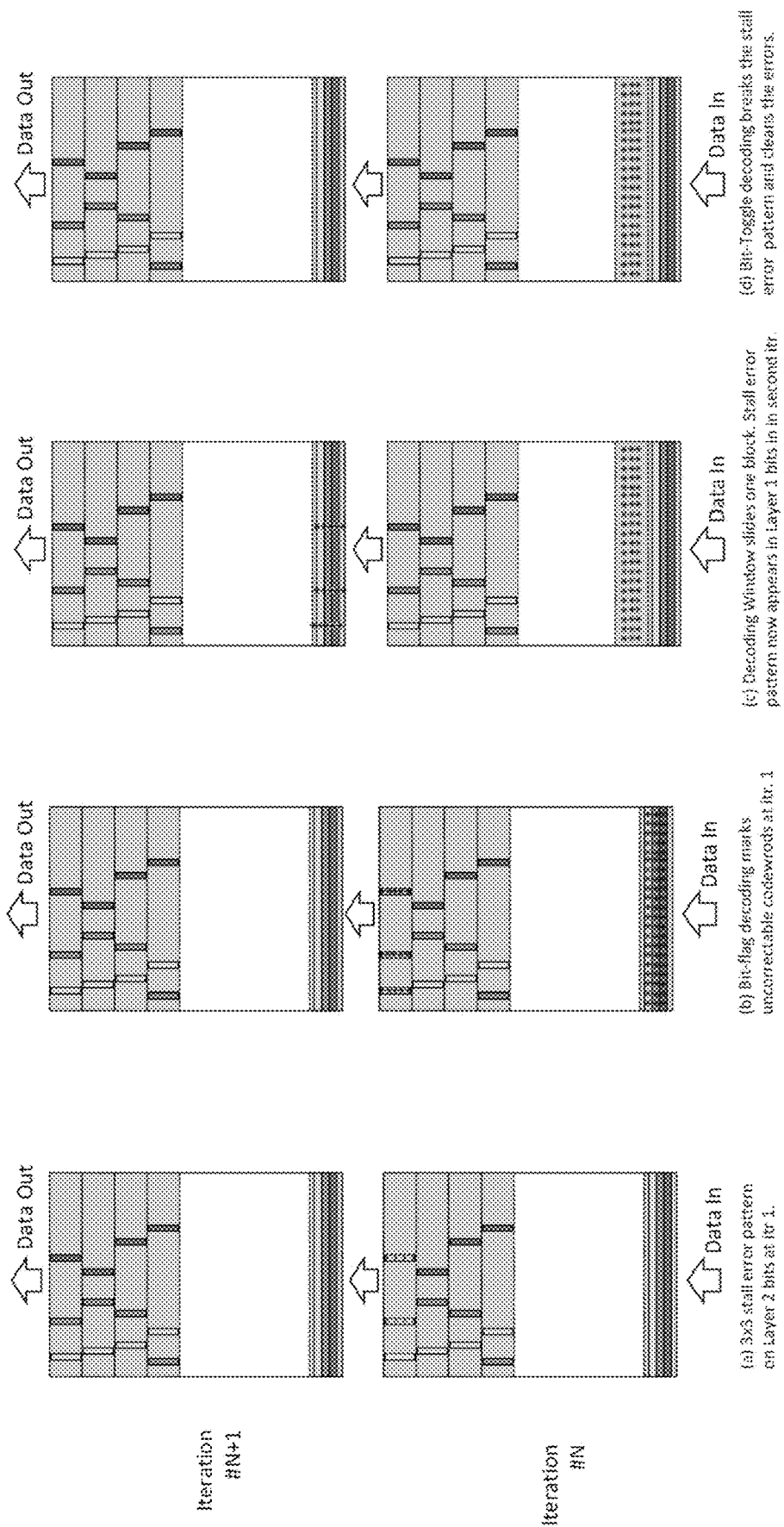
FIG. 5C depicts an example of decoding a random CI-BCH code.
Figure 5D:
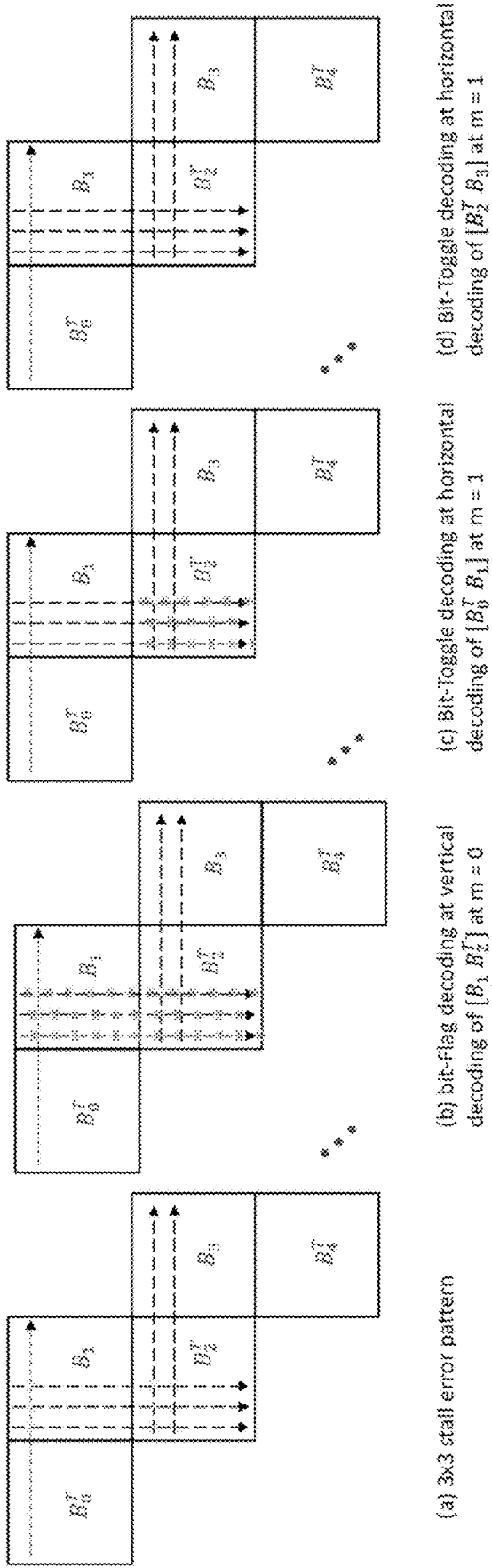
FIG. 5D depicts an example of decoding a staircase code.

FIGS. 5C and 5D relate to decoding convolutional codes. To simplify the decoding in convolutional codes, a window of limited length that contains a few independent iterations (L) worth of symbols can be utilized. For staircase codes, L can be any integer greater than or equal to 1. And that means the size of the decoding window is L times the size of one block of symbols which is (n/2)×(n/2). The decoding may occur a few times (M) in a specific arrangement for example from beginning to the end of the window. Then the window slides one block over data. The earliest block of symbols that came to the window is sent out as decoded symbols. A new block of symbols come into the window to be decoded after L slides of window. The decoded symbols are visited M x L x 2 by the decoder circuit. The factor "2" is included because each bit appears in both horizontal and vertical decoding in each full iteration.

FIG. 5C depicts an example of decoding a random CI-BCH code with M=1. In this example, two consecutive decoding iterations (itr. N and itr. N+1) can be performed. At each time slot one block of data is processed. Bit-Flag decoding is performed for the codewords which have the Layer 1 symbols on the bottom block of iteration 1 memory. Bit-Toggle decoding is performed for the codewords which have the Layer 1 symbols on the bottom block iteration 2 memory.

In FIG. 5C, a 3 ×3 stall error pattern in Layer 2 bits of the first iteration as shown in figure (a). All the other bits are assumed to be error free. Bit-Flag decoding in iteration 1 causes all bits of uncorrectable codewords to be flagged as shown in figure (b).

Bit-Toggle decoding in iteration 2 is performed. As no bit is flagged and syndromes are all zero, no bit is flipped. The window slides one block. So the top block Layer 2 symbols of iteration 1 is appeared as Layer 1 symbols of iteration 2 as shown in FIG. 5O-(c). Bit-Flag decoding is performed in iteration one. All codewords are clean. No bit is flagged. Layer 2 symbols may get unflagged. Bit-Toggle decoding in iteration 2 Breaks the stall error pattern and correct all the erroneous bits as shown in FIG. 5C-(d).

FIG. 5D depicts an example of decoding a staircase code. In the example shown in FIG. 5D, M=2, L=5. Row decoding of all blocks is performed first, and then the column decoding of all blocks is performed next in each row and column full decoding iteration, i.e., $[B_0^T\ B_1]$, $[B_2^T\ B_3]$ are decoded first. $[B_1\ B_2^T]$ and $[B_3\ B_4^T]$ are decoded second. The steps for decoding in FIG. 5D can be described as follows:

When m=0:
Regular hard decoding on $[B_0^T, B_1]$, $[B_2^T, B_3]$. See FIG. 5D-(a).
Bit-Flag hard decoding on $[B_1, B_2^T]$. See FIG. 5D-(b).
Regular hard decoding on $[B_3, B_4^T]$.

Figure 6:
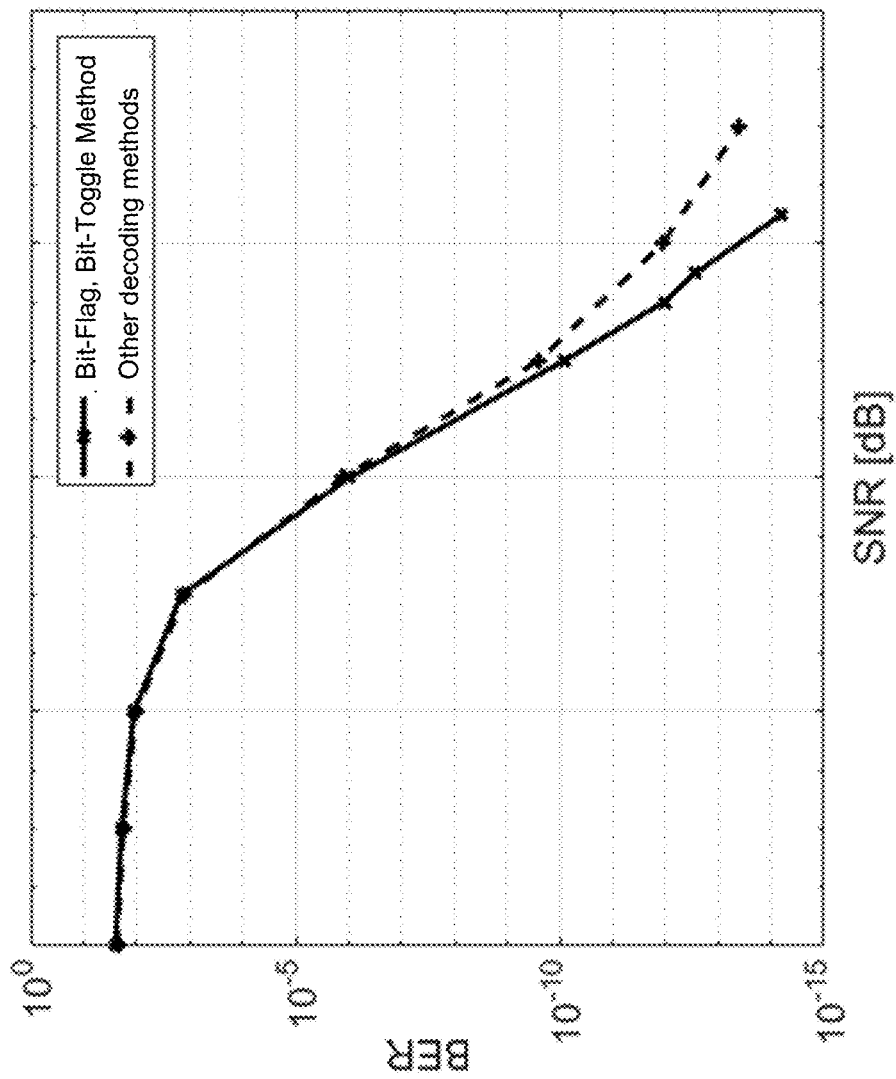
FIG. 6 depicts a graph illustrating one example of the improvement in error floor performance achieved through application of the decoding methods described in this disclosure.

When m=1:
Bit-Toggle hard decoding on $[B_0^T, B_1]$. See FIG. 5D-(c).
Bit-Toggle hard decoding on $[B_2^T, B_3]$. See FIG. 5D-(d).
Regular hard decoding on $[B_1, B_2^T]$, and $[B_3, B_4^T]$ FIG. 6 illustrates how using the methods and systems described in this disclosure can substantially improve error floor performance results. The dashed lined in FIG. 6 shows the BER achieved when using other decoding methods. These methods are limited in performance because of the inability to resolve errors in the code in a timely manner thereby contributing to a higher error floor. In contrast, using the Bit-Flag Bit-Toggle decoding method described in this disclosure, the $1 \times 10^{-15}$ BER floor can be attained faster and at lower signal-to-noise-ratio (SNR).

While this specification contains many specifics, these should not be construed as limitations on the scope of the disclosure or of what may be claimed, but rather as descriptions of features specific to particular implementations. Certain features that are described in this specification in the context of separate implementations may also be combined. Conversely, various features that are described in the context of a single implementation may also be implemented in multiple implementations separately or in any suitable sub-combination. Moreover, although features may be described above as acting in certain combinations and may even be claimed as such, one or more features from a claimed combination may, in some cases, be excised from the combination, and the claimed combination may be directed to a sub-combination or variation of a sub-combination. For example, although the mapping operation is described as a series of discrete operations, the various operations may be divided into additional operations, combined into fewer operations, varied in order of execution, or eliminated, depending on the desired implementation. Similarly, the separation of various system components in the implementations described above should not be understood as requiring such separation in all implementations.

Some implementations of subject matter and operations described in this specification can be implemented in digital electronic circuitry, or in computer software, firmware, or hardware, including the structures disclosed in this specification and their structural equivalents, or in combinations of one or more of them. For example, in some implementations, some or all of the components described herein can be implemented using digital electronic circuitry, or in computer software, firmware, or hardware, or in combinations of one or more of them. In another example, one or more of the operations described above with respect to FIGS. 4 and 5 can be implemented using digital electronic circuitry, or in computer software, firmware, or hardware, or in combinations of one or more of them.

Some implementations described in this specification can be implemented as one or more groups or modules of digital electronic circuitry, computer software, firmware, or hardware, or in combinations of one or more of them. Although different modules can be used, each module need not be distinct, and multiple modules can be implemented on the same digital electronic circuitry, computer software, firmware, or hardware, or combination thereof.

Some implementations described in this specification can be implemented as one or more computer programs, i.e., one or more modules of computer program instructions, encoded on computer storage medium for execution by, or to control the operation of, data processing apparatus. A computer storage medium can be, or can be included in, a computer-readable storage device, a computer-readable storage substrate, a random or serial access memory array or device, or a combination of one or more of them. Moreover, while a computer storage medium is not a propagated signal, a computer storage medium can be a source or destination of computer program instructions encoded in an artificially generated propagated signal. The computer storage medium also can be, or can be included in, one or more separate physical components or media (e.g., multiple CDs, disks, or other storage devices).

The term "data processing apparatus" encompasses all kinds of apparatus, devices, and machines for processing data, including by way of example a programmable processor, a computer, a system on a chip, or multiple ones, or combinations, of the foregoing. The apparatus can include special purpose logic circuitry, e.g., an FPGA (field programmable gate array) or an ASIC (application specific integrated circuit). The apparatus also can include, in addition to hardware, code that creates an execution environment for the computer program in question, e.g., code that constitutes processor firmware, a protocol stack, a database management system, an operating system, a cross-platform runtime environment, a virtual machine, or a combination of one or more of them. The apparatus and execution environment can realize various different computing model infrastructures, such as web services, distributed computing and grid computing infrastructures.

A computer program (also known as a program, software, software application, script, or code) can be written in any form of programming language, including compiled or interpreted languages, declarative or procedural languages. A computer program may, but need not, correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

Some of the processes and logic flows described in this specification can be performed by one or more programmable processors executing one or more computer programs to perform actions by operating on input data and generating output. The processes and logic flows also can be performed by, and apparatus also can be implemented as, special purpose logic circuitry, e.g., an FPGA (field programmable gate array) or an ASIC (application specific integrated circuit).

Processors suitable for the execution of a computer program include, by way of example, both general and special purpose microprocessors, and processors of any kind of digital computer. Generally, a processor will receive instructions and data from a read only memory or a random access memory or both. A computer includes a processor for performing actions in accordance with instructions and one or more memory devices for storing instructions and data. A computer may also include, or be operatively coupled to receive data from or transfer data to, or both, one or more mass storage devices for storing data, e.g., magnetic, magneto optical disks, or optical disks. However, a computer need not have such devices. Devices suitable for storing computer program instructions and data include all forms of non-volatile memory, media and memory devices, including by way of example semiconductor memory devices (e.g., EPROM, EEPROM, flash memory devices, and others), magnetic disks (e.g., internal hard disks, removable disks, and others), magneto optical disks, and CD-ROM and DVD-ROM disks. The processor and the memory can be supplemented by, or incorporated in, special purpose logic circuitry.

A computer system may include a single computing device, or multiple computers that operate in proximity or remote from each other and typically interact through a communication network. Examples of communication networks include a local area network ("LAN") and a wide area network ("WAN"), an inter-network (e.g., the Internet), and peer-to-peer networks (e.g., ad hoc peer-to-peer networks). A relationship of client and server may arise by virtue of computer programs running on the respective computers and having a client-server relationship to each other.

Terms used herein and in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

Additionally, if a specific number of an introduced claim recitation is intended, such an intent will be explicitly recited in the claim, and in the absence of such recitation no such intent is present. For example, as an aid to understanding, the following appended claims may contain usage of the phrases "at least one" and "one or more" to introduce claim recitations. However, the use of such phrases should not be construed to imply that the introduction of a claim recitation by the indefinite articles "a" or "an" limits any particular claim containing such introduced claim recitation to implementations containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations.

In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together. The term "and/or" is also intended to be construed in this manner.

The use of the terms "first," "second," "third," etc., are not necessarily used herein to connote a specific order or number of elements. Generally, the terms "first," "second," "third," etc., are used to distinguish between different elements as generic identifiers. Absent a showing that the terms "first," "second," "third," etc., connote a specific order, these terms should not be understood to connote a specific order. Furthermore, absence a showing that the terms "first," "second," "third," etc., connote a specific number of elements, these terms should not be understood to connote a specific number of elements.

Various modifications can be made to the foregoing examples. Accordingly, other implementations also are within the scope of the claims.

What is claimed is:

1. A device comprising:
an optical receiver configured to receive a communication optical signal including a plurality of optical subcarriers from a communication network, one of the plurality of optical subcarriers carrying data encoded using a generalized product code; and
at least one processor coupled to the receiver and comprising a decoder, the at least one processor being configured to:
for a first decoding iteration:
determine whether a number of errors associated with a first codeword of a block code in the data encoded using the generalized product code satisfies a capacity threshold; and
in response to determining that the number of errors associated with the first codeword does not satisfy the capacity threshold, set flags for bits in the first codeword;
for a second decoding iteration that follows the first decoding iteration:
determine whether a number of errors associated with a second codeword of the block code satisfies a second threshold; and
in response to determining the number of errors associated with the second codeword does not satisfy the second threshold,
identify flagged bits in the second codeword;
generate at least one test pattern based on the flagged bits;
determine syndromes for the at least one test pattern;
decode the at least one test pattern;
select one of the at least one test pattern based on a selection criterion; and
clear the flagged bits.

2. The device of claim 1, wherein the first decoding iteration is a first half of a decoding iteration and the second decoding iteration is a second half of the decoding iteration that sequentially follows the first half of the decoding iteration.

3. The device of claim 2, wherein:
the first codeword is a codeword extending in a horizontal direction across a block of the data and the second codeword is a codeword extending in a vertical direction across a block of the data; or
the first codeword is a codeword extending in a vertical direction across a block of the data and the second codeword is a codeword extending in a horizontal direction across the block of the data.

4. The device of claim 1, wherein the first decoding iteration is a first decoding iteration and the second decoding iteration is a second decoding iteration that sequentially follows the first decoding iteration.

5. The device of claim 4, wherein:
the first codeword is a codeword extending in a horizontal direction across a block of the data, and the second codeword is a codeword extending in a vertical or horizontal direction across the block of the data; or
the first codeword is a codeword extending in a vertical direction across a block of the data, and the second codeword is a codeword extending in a vertical or horizontal direction across the block of the data.

6. The device of claim 1, comprising:
a memory to store location information of the bits in the first codeword for which flags were set,
wherein the memory is configured to provide location information of the flagged bits in the second codeword to the decoder.

7. The device of claim 1, wherein the at least one processor is configured to:
   determine whether syndromes in the first codeword are zero; and
   in response to determining that the syndromes in the first codeword are not zero, determine whether the number of errors associated with the first codeword satisfy the capacity threshold.

8. The device of claim 1, wherein the at least one processor is configured to:
   determine whether syndromes in the second codeword are zero; and
   in response to determining that the syndromes in the second codeword are not zero, determine whether the number of errors associated with the second codeword satisfy the second threshold.

9. The device of claim 1, wherein to select one of the at least one test pattern based on a selection criterion, the at least one processor is configured to select a test pattern that (1) has a minimum number of bits flipped with respect to an original input sequence of the second codeword, and (2) has been decoded without errors.

10. A method to decode data encoded using a generalized product code, the method comprising:
    receiving, from a communication network, a plurality of optical subcarriers, one of the plurality of optical subcarriers carrying the data encoded using the generalized product code;
    for a first decoding iteration:
      determining, by at least one processor, whether a number of errors associated with a first codeword of a block code in the data encoded using the generalized product code satisfies a capacity threshold; and
      in response to determining that the number of errors associated with the first codeword does not satisfy the capacity threshold, setting flags for bits in the first codeword;
    for a second decoding iteration that follows the first decoding iteration:
      determining whether a number of errors associated with a second codeword of the block code satisfies a second threshold; and
      in response to determining the number of errors associated with the second codeword does not satisfy the second threshold,
        identifying flagged bits in the second codeword;
        generating at least one test pattern based on the flagged bits;
        determining syndromes for the at least one test pattern;
        decoding the at least one test pattern;
        selecting one of the at least one test pattern based on a selection criterion; and
        clearing the flagged bits.

11. The method of claim 10, wherein the first decoding iteration is a first half of a decoding iteration and the second decoding iteration is a second half of the decoding iteration that sequentially follows the first half of the decoding iteration.

12. The method of claim 11, wherein:
    the first codeword is a codeword extending in a horizontal direction across a block of the data and the second codeword is a codeword extending in a vertical direction across a block of the data; or
    the first codeword is a codeword extending in a vertical direction across a block of the data and the second codeword is a codeword extending in a horizontal direction across the block of the data.

13. The method of claim 10, wherein the first decoding iteration is a first decoding iteration and the second decoding iteration is a second decoding iteration that sequentially follows the first decoding iteration.

14. The method of claim 13, wherein:
    the first codeword is a codeword extending in a horizontal direction across a block of the data, and the second codeword is a codeword extending in a vertical or horizontal direction across the block of the data; or
    the first codeword is a codeword extending in a vertical direction across a block of the data, and the second codeword is a codeword extending in a vertical or horizontal direction across the block of the data.

15. The method of claim 10, wherein the generalized product code comprises a turbo block code or a continuously interleaved Bose-Chaudhuri-Hocquenghem code.

16. The method of claim 10, comprising:
    determining whether syndromes in the first codeword are zero; and
    in response to determining that the syndromes in the first codeword are not zero, determining whether the number of errors associated with the first codeword satisfy the capacity threshold.

17. The method of claim 10, comprising:
    determining whether syndromes in the second codeword are zero; and
    in response to determining that the syndromes in the second codeword are not zero, determining whether the number of errors associated with the second codeword satisfy the second threshold.

18. The method of claim 10, wherein selecting one of the at least one test pattern based on a selection criterion comprises:
    selecting a test pattern that (1) has a minimum number of bits flipped with respect to an original input sequence of the second codeword, and (2) has been decoded without errors.

19. A receiver comprising:
    a photodetector circuit operable to provide an electrical signal indicative of data carried by one of a plurality of optical subcarrier provided to the photodetector circuit;
    a memory configured to store the data and provide the data to one or more components of the receiver; and
    a decoder coupled to the memory and configured to obtain the data from the memory, the decoder being configured to:
      flag bits in a first codeword of a block code of the data in a first decoding iteration of the block code;
      identify at least one of the flagged bits in the block code in a second decoding iteration of the block code, the second decoding iteration occurring after codewords in the block code have been processed in the first decoding iteration;
      generate a test pattern based on the identified at least one of the flagged bits; and
      decode the block code based on the test pattern.

20. The receiver of claim 19, wherein the at least one of the flagged bits in the block code are identified in response to the decoder determining that a second codeword in the block code has a number of errors that is not less than a threshold.

* * * * *